United States Patent [19]
Schlais et al.

[11] Patent Number: 5,930,613
[45] Date of Patent: Jul. 27, 1999

[54] METHOD OF MAKING EPROM IN HIGH DENSITY CMOS HAVING METALLIZATION CAPACITOR

[75] Inventors: John Robert Schlais, Gurnee, Ill.; Randy Alan Rusch, Kokomo, Ind.

[73] Assignee: Delco Electronics Corporation, Kokomo, Ind.

[21] Appl. No.: 08/963,356

[22] Filed: Nov. 3, 1997

[51] Int. Cl.⁶ .............................................. H01L 21/8247
[52] U.S. Cl. ........................... 438/201; 438/241; 438/258
[58] Field of Search ..................................... 438/201, 210, 438/211, 241, 258

[56] References Cited

U.S. PATENT DOCUMENTS

| | | | |
|---|---|---|---|
| 5,014,098 | 5/1991 | Schlais et al. .......................... | 357/23.5 |
| 5,290,725 | 3/1994 | Tanaka et al. .......................... | 438/201 |
| 5,591,658 | 1/1997 | Cacharelis ............................... | 438/201 |
| 5,702,988 | 12/1997 | Liang ....................................... | 438/258 |
| 5,712,178 | 1/1998 | Cho et al. ................................ | 438/201 |

*Primary Examiner*—Chandra Chaudhari
*Attorney, Agent, or Firm*—Jimmy L. Funke

[57] ABSTRACT

A method of making an EPROM transistor in a high density CMOS integrated circuit having a gate electrode to metallization capacitor. The EPROM transistor is made using only the steps used to make the other components of the high density CMOS integrated circuit. The EPROM transistor is programmable at low voltages which high density CMOS transistors can handle.

10 Claims, 7 Drawing Sheets

METHOD OF MAKING EPROM IN HIGH DENSITY CMOS HAVING METALLIZATION CAPACITOR

RELATED PATENT APPLICATIONS AND PATENT

This patent application is related to the following two patent applications, that were filed on or about the same date as this patent application, that were filed in the names of J. R. Schlais and R. A. Rusch, and that are assigned to the same assignee as this patent application:

Attorney docket number H-188616, appl. Ser. No. 08/963,489, U.S. Pat. No. 5,872,034, entitled "EPROM in Double Poly High Density CMOS"; and Attorney docket number H-194837, appl. Ser. No. 08/963,463, entitled "EPROM in High Density CMOS Having Added Substrate Diffusion".

This patent application is also related to U.S. Pat. No. 5,014,098, entitled "CMOS Integrated Circuit with EEPROM and Method of Manufacture", that was issued May 7, 1991 to J. R. Schlais, R. A. Rusch and T. H. Simacek, and assigned to the assignee of this patent application.

The above disclosures are incorporated herein by reference.

BACKGROUND OF THE INVENTION

1. Field of the Invention

This invention relates to a CMOS integrated circuit having an EPROM incorporated therein, and to a method of making the same. More particularly, this invention relates to an EPROM structure that is manufacturable using precisely the same process steps that are used to make a small geometry, i.e., high density, CMOS integrated circuit. In other words, no steps need be added to or subtracted from those used in making the small geometry CMOS integrated circuit. Accordingly, the EPROM can be made on the same chip as the small geometry CMOS transistors without compromising the CMOS transistors in any way, especially their speed of operation.

2. Description of the Prior Art

As indicated above, this invention relates to a high density CMOS integrated circuit having an EPROM (electrically programmable read only memory) device. The term "CMOS" is used in its usual context, but is also hereinafter defined for completeness of disclosure. An "EPROM" is a nonvolatile memory integrated circuit unit. It is thus an integrated circuit that has a memory that remains without the need of a power source. Hence, it is a lasting, or permanent, memory. As indicated by its name, an EPROM nonvolatile memory unit can be electrically programmed after manufacture. In addition, the programming, i.e., also the memory, can be erased as a single block by exposing the EPROM chip to ultraviolet light.

The EPROM is not to be confused with an EEPROM (electrically erasable programmable read only memory) device. An EEPROM is thus a nonvolatile memory integrated circuit unit. However, its programming can be selectively changed, i.e., erased, at each of its MOS transistor memory gates. Moreover, the EEPROM programming is changed electrically, not by the application of ultraviolet light. This requires additional process steps on an integrated circuit chip, which increases its cost significantly.

The EPROM and EEPROM nonvolatile memory integrated circuits are comprised of special types of MOS (metal oxide semiconductor) transistors that are often arranged in arrays. As is known, MOS transistors are also referred to as insulated gate field effect transistors (IGFETs). An IGFET has a control gate electrode that is disposed over a channel region that extends between spaced but adjacent source and drain regions embedded in a semiconductor surface. IGFETs of an EPROM and EEPROM memory array are a special form of IGFET in that they also have a second gate electrode. We sometimes herein refer to such IGFETs as EPROM transistors. The second gate electrode of such transistors is an electrically floating electrode that is disposed above the IGFET channel region but below the control gate electrode hereinbefore mentioned. It is electrically floating because it is electrically insulated from the control gate above it and the channel region below it, and has no electrical conductor for accessing it. An electrical charge is normally placed on the floating gate by the effects of tunneling or avalanche injection. Once an electrical charge is placed on the floating gate, the charge is trapped there until it is deliberately removed in some way.

The trapped charge on the floating gate raises the threshold voltage of the underlying channel region of that IGFET. This raises the "turn on" voltage of that IGFET to a value above the voltage usually applied to turn that IGFET "on". Accordingly, that IGFET stays "off" even when a normal turn on voltage is applied to its gate. A floating gate IGFET memory unit of an EPROM or EEPROM memory array is thus "programmed" from a "one" to a "zero" by charging its floating gate. Selected floating gate IGFETs in an EPROM or EEPROM memory array which have been so programmed, will not turn on when the usual "turn on" voltage is applied to them. So programming the selected IGFETs of an EPROM or EEPROM memory array is also referred to herein as programming the EPROM or EEPROM memory. Such "programming" can be erased, i.e., removed, by exposing an EPROM or EEPROM memory array to ultraviolet light, which allows the trapped charge on the floating gate of each programmed IGFET to escape. Such "programming" of an EEPROM can more conveniently be erased electrically by applying an appropriate electrical potential between the control (or "charging") gate and the channel of each programmed IGFET.

The related U.S. Pat. No. 5,014,098 relates to forming an EEPROM in a CMOS integrated circuit. It discusses the difficulties of the past in including nonvolatile memory devices in high density CMOS integrated circuit applications. In order to achieve high packing density, the cell size of the nonvolatile memory was minimized. One convenient way to reduce the cell size was to use a high programming voltage, allowing the capacitance between the control (or "charging") gate and the floating gate to be small. For Fowler-Nordheim tunneling, the tunnel oxide current equation dictates an absolute value of voltage required to pass tunnel current through it for a given tunnel oxide thickness. To obtain this voltage on the floating gate, the control gate voltage has to be increased when the ratio of control gate/floating gate capacitance to floating gate/substrate capacitance is small. Also, for such tunneling to occur, a portion of the oxide between the floating gate and the channel must be thinner than is ordinarily used in the high density CMOS transistors.

The voltage applied to the floating gate (to achieve programming) is determined by the voltage applied to the control gate, and the ratio of (a) the control gate to floating gate capacitance to (b) the floating gate to substrate capacitance. This is what we mean by programming capacitance ratio. As the programming capacitance ratio increases, the programming voltage reduces. In other words, with a higher programming capacitance ratio, a lower control gate voltage can be used to trap enough charge on the floating gate to noticeably raise IGFET threshold voltage.

The capacitive ratio is primarily affected by the layout of the cell, i.e., a larger cell size will typically have a larger capacitance ratio. U.S. Pat. No. 5,014,098, shows that the floating gate and the control gate can be laid out with integral mutually overlapping plate-like enlargements that extend up onto field oxide adjacent the channel region of the EEPROM IGFET from which they extend. This increases the capacitance between the two gates without significantly increasing the floating gate to substrate (i.e., channel) capacitance.

There are many applications where it is desirable to combine nonvolatile memory with CMOS logic circuits. CMOS logic circuits are formed of complementary MOS transistors, or IGFETs. By complementary, we mean that the MOS transistors include both n-channel and p-channel MOS transistors. If one desires to make such logic circuits in high density (for high performance logic), the high density, i.e., small geometry, nonvolatile memory must be designed with relatively deep source and drain junctions and thick field oxides, to accommodate high voltage programming. On the other hand, high density CMOS ideally should have shallow junctions, thinner gate oxides and thinner field oxides, because it would operate at 5 volts or less. Attempts to integrate even small amounts of such high density nonvolatile memory circuity with a high density CMOS logic circuitry, necessitates that the entire integrated circuit be dominated in some key respects by the requirements of the nonvolatile memory high voltage circuitry. The nonvolatile memory requirements tend to degrade the performance and reliability of the high density and low voltage CMOS logic, which typically has shallow source and drain junctions, thinner gate oxides and thinner field oxides. The high voltage junctions used in the nonvolatile memory devices require deeper diffusions, which leads to longer channel lengths for the CMOS logic, to avoid short channel effects. This is undesirable since it results in slower logic devices. The thick field oxide of the nonvolatile memory devices increases the lateral encroachment, or "birds beak", in the CMOS logic. Hence, a greater limitation is present in the minimum pitch of doped regions. Another, and longer range, result of this is the limited shrinkability of such an integrated circuit device and process with a high density/high voltage nonvolatile memory device included.

At present, when forming a CMOS logic circuit with an EPROM or EEPROM device in a stacked polycrystalline silicon FLOTOX technology, i.e., polycrystalline silicon gates and a thin insulator for electron tunneling, compromises are required in order to insure that one of the polycrystalline layers of the nonvolatile memory device can be shared with the logic devices. This is usually done in one of two ways. One method is to first define the floating gate of the EPROM or EEPROM. A high temperature dielectric oxide is then grown which also serves as the gate oxide of the CMOS devices and the control gate dielectric of the nonvolatile memory device. Then the second layer of polycrystalline silicon is used to form the CMOS gates and the nonvolatile memory control gate. Thus, the same layer of polycrystalline silicon is shared for the control gate of the nonvolatile memory device and the CMOS gates. In this method, formation of the high temperature dielectric oxide for the CMOS and control gate tends to degrade the characteristics of the tunnel oxide in the nonvolatile memory device. This high temperature also shifts the implants in the CMOS devices, and thus creates a shift in the electrical characteristics of the resultant CMOS devices from what the original MOS process would produce without inclusion of the nonvolatile memory device processing. Also, it is difficult to make a reliable gate dielectric from the silicon dioxide grown between the floating gate and the control gate of the nonvolatile memory device.

The second method is to grow the gate oxide and then mask and etch the windows for the tunnel oxide. A pre-cleaning step for growth of the tunnel oxide then follows. The tunnel oxide is then grown, followed by a pre-polycrystalline silicon deposition cleaning step and a polycrystalline silicon deposition step. The first polycrystalline silicon layer is shared between the CMOS devices and the floating gate of the nonvolatile memory device. In this latter prior art method, the steps required between the gate oxidation and polycrystalline silicon deposition degrade the gate oxide and thus the performance of the CMOS circuit. The gate oxide is degraded by placing photoresist on it for the tunnel mask, the pre-tunnel oxide clean, and the tunnel oxidation itself. These steps may introduce contaminants into the gate oxide, and will certainly alter the thickness of the gate oxide during the tunnel oxidation.

It is therefore desirable to have a high reliability CMOS logic circuit in which a nonvolatile memory device can be included with negligible impact on both the CMOS circuit and the nonvolatile memory device. The related U.S. Pat. No. 5,014,098 shows how an EEPROM can be so included by adding process steps to the usual CMOS process that only have negligible impact on the CMOS devices. On the other hand, it is to be noted that additional process steps do in fact have to be included, which increases cost of the process, and might slightly reduce yields. In addition, the added conductor pattern needed for electrically erasing an EEPROM, significantly expands the size an EEPROM nonvolatile memory unit over that of an EPROM nonvolatile memory. This can increase cost significantly.

As indicated above, the nonvolatile memory device that is made in the related U.S. Pat. No. 5,014,098 is an EEPROM, not an EPROM. An electrical charge can be put on its floating gate by any one of several techniques, including the Fowler-Nordheim Tunneling action shown in the related U.S. Pat. No. 5,014,098. However, Fowler-Nordheim Tunneling requires that a spot of the gate oxide on the channel region be thinner than normal gate oxide. As also indicated above, this requires adding special steps to the process used to make the CMOS integrated circuit, to form the thinner oxide. However, the addition of the extra steps is offset by the benefit that the thinner oxide also permits electrical erasing by Fowler-Nordheim Tunneling, as disclosed in the related U.S. Pat. No. 5,014,098. Hence, Fowler-Nordheim Tunneling permits easy, fully electrical, reprogramming of the EEPROM on a selective IGFET basis.

We have now recognized that electrical erasing of a PROM is often not needed. In fact, no erasing at all may be needed, or that erasing prior to encapsulation is all that might be needed. In addition, we have recognized that block erasing, as opposed to selective IGFET erasing, may be satisfactory in many applications. Accordingly, we have recognized that an EPROM nonvolatile memory may be as useful as an EEPROM nonvolatile memory in many applications. Further, we have recognized that avalanche injection can be used to charge the floating gate of an EPROM using normal "gate" oxide thicknesses, i.e., oxide thickness between the floating gate and its underlying channel region. Still further, we have recognized that avalanche injection into the floating gate of an EPROM can he done at low voltages if the control gate/floating gate to floating gate/ substrate capacitance ratio is about two or greater. Still further, we have found that an EPROM can be included in a high performance CMOS integrated circuit unit using exactly the same process steps as are used to make the high performance CMOS transistors in such a unit. In other words, no steps need to be added to or subtracted from the high performance CMOS process in order to also make the EPROM on the same chip. All that is needed is to include our special EPROM structure features in selected ones of the masks used to make the CMOS circuitry. Accordingly, in our invention, a nonvolatile memory unit can be included in a CMOS integrated circuit made with two micron or less design rules, without any penalties or compromises at all in the CMOS circuitry.

SUMMARY OF THE INVENTION

The present invention is directed to an integrated circuit which comprises a distinctive erasable programmable read only memory (EPROM) combined in a unique way in a monolithic integrated circuit with high speed, or high performance, CMOS circuitry. By CMOS circuitry, we mean circuitry that is predominantly formed with complementary metal oxide semiconductor (MOS) transistors, i.e., n-channel and p-channel MOS transistors. As indicated above, MOS transistors are also referred to as IGFETs. By high speed, we mean that the design rule channel length of the CMOS transistors is about 2 microns or less. Ordinarily, the circuitry being referred to is CMOS logic circuitry on a monolithic integrated circuit chip, as, for example, a microprocessor chip. It is not unusual for other forms of circuitry also to be present on such a chip.

Thus, in the present invention, we focus on a monolithic integrated circuit that includes high performance CMOS circuitry and also some EPROM nonvolatile memory. The CMOS circuitry (i.e., he logic circuitry) is high performance because it has small geometry devices (i.e., two micron or less channel lengths), which gives the CMOS circuitry high density and high speed. An important feature of the invention is that the EPROM is present without adversely affecting the high performance characteristics of the CMOS circuitry. Another important feature of the invention is that the EPROM is made using the exactly the same process steps used to make the high performance CMOS part of the circuitry. We sometimes refer to the high performance CMOS process steps as "two micron" process steps. By "two micron CMOS process", we mean a CMOS process having design rules allowing the mask for etching a polycrystalline silicon layer, which forms an IGFET gate electrode, to have a feature size of about two microns. By "feature size", we mean the nominal linear dimension of a polycrystalline silicon gate electrode between its associated source and drain in an IGFET. This dimension is also referred to as gate length of an IGFET. Accordingly, in our invention, the feature size of at least the CMOS circuitry in the integrated circuit is about two microns. With source and drain junction depths of about 0.35 micron, and a design rule feature size of two microns, the actual resulting channel length will be about 1.5 microns, due to lateral diffusion of the source and drain regions under opposite edges of the polysilicon gate electrode.

IGFETs having channel lengths less than two microns are often considered to be "high performance" or "high speed" in logic operation. For purposes of this invention, when we refer to a "high speed CMOS process", we mean a process capable of making CMOS logic IGFETs having channel lengths of less than about two microns. The EPROM may or may not have such a feature size, depending on the application.

In addition, the EPROM of this invention is programmable at voltages low enough to be handled by the high speed CMOS circuitry, which is usually about 5 volts or less. Accordingly, the CMOS transistor circuitry can be used to program the EPROM. This is true even though the EPROM has relatively thick gate oxide that does not permit Fowler-Nordheim tunneling.

In this invention, the high speed CMOS integrated circuit is one that would not only include high speed complementary MOS transistors but also include a poly to metallization capacitor, such as what might be used to make a relatively moderate value capacitor in the high speed CMOS integrated circuit. Such a moderate value capacitor is made by providing a relatively large area of field oxide, disposing a relatively large plate of polycrystalline silicon on the large area of field oxide, providing a thin layer of dielectric on the polycrystalline silicon plate, and then covering the dielectric with metal from the metallization pattern used to form electrical contacts to the integrated circuit. In this invention, we select some of the same steps used to produce the MOS transistors and the poly to metallization capacitors, and then combine them to also make distinctive floating gate and control (or "charging") gate structures for our EPROM. These distinctive gate structures provide a capacitance ratio, between (a) the control gate to floating gate capacitance and (b) the floating gate to substrate (i.e., essentially the IGFET channel) capacitance, of about 2 or greater.

Such a capacitance ratio of about 2 or more permits the EPROM to have a normal gate oxide thickness under the floating gate and yet be programmable at voltages less than the parasitic breakdown voltages of the high speed CMOS circuitry. By "normal" gate oxide thickness, we mean the same gate oxide thickness that is used for the CMOS circuitry on that silicon chip. Accordingly, all that is needed to include an EPROM in a high performance CMOS circuit, is to incorporate some changes in selected masks used to make the CMOS circuit. No process steps need be added to the high speed CMOS process, as is needed in U.S. Pat. No. 5,014,098 Schlais, et al.

Other objects, features and advantages of this invention will become more apparent from the following detailed description taken together with the accompanying drawing and claims.

BRIEF DESCRIPTION OF THE DRAWING

FIGS. 1–16 successively show use of a typical CMOS two micron process with poly to metallization capacitor to form in that surface portion (from left to right in the Figures) a p-channel IGFET, an n-channel IGFET, a poly to metallization capacitor, and an EPROM that uses the metal layer of a poly to metallization capacitor as a charging gate. A two micron process is explained above. In this invention, the charging gate of the EPROM is formed at the same time and by the same process steps that are used to form the metal top plate of the poly to metallization capacitor. The polycrystalline silicon layer that is used to form the IGFET gate electrodes and the lower plate of the poly to metallization capacitor is also used to form the floating gate of cur distinctive EPROM. It is defined at the same time the high speed CMOS IGFET gate electrodes are defined, and abe defined by the 2 micron or less design rules.

It should be understood that the various sheets of the Drawing are not necessarily drawn to scale, and exaggerations in thickness and relative sizes have been made to facilitate an easier understanding of the invention. Also, for easier comparison with the contemporaneously filed related patent application Attorney Docket H-188616 referred to above, similar reference numerals for similar parts of the Drawing are used, to the extent practical. However, this invention differs from Ser. No. 08/963,489 by having a poly to metallization capacitor on field oxide and by not having a second layer of polycrystalline silicon. Reference numerals relating to the formation of the second layer of polysilicon in the above-mentioned related Attorney Docket H-188616 are thus omitted in this description. Except where believed to be helpful, background lines are omitted in the Figures for added clarity of illustration.

DETAILED DESCRIPTION

Figure 1:
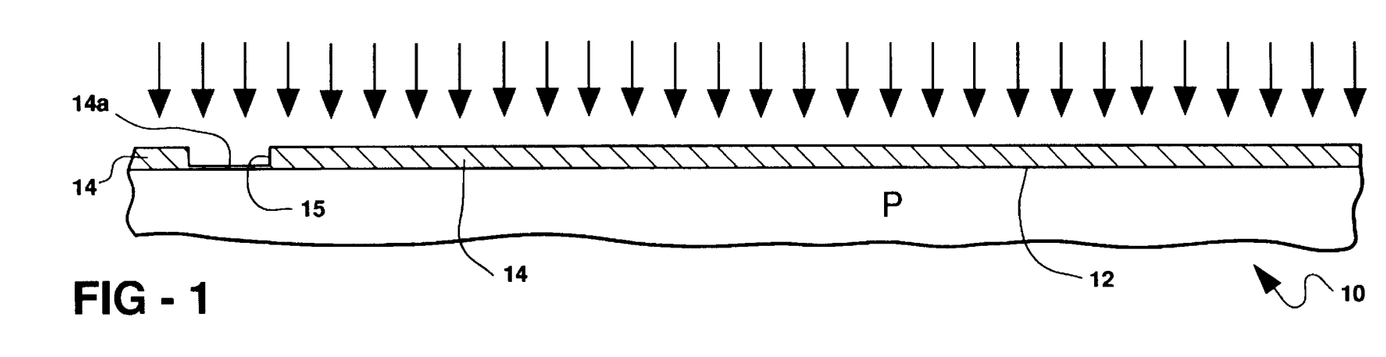
FIGS. 1–16 each show a cross-sectional view through the same surface portion of a monocrystalline silicon wafer. The silicon surface portion shown in FIGS. 1–16 is but one part of one chip in a silicon wafer that contains a plurality of such chips.

As shown in FIG. 1, a typical high speed CMOS process would start with an initial oxidation of a p-type silicon monocrystalline wafer 10. As indicated above, by high speed CMOS process, we mean a process for producing small geometry CMOS IGFETs with shallow junctions. By small geometry, we mean that the design rules for the process are for two micron or less. Also as indicated above, by a CMOS process having "two micron design rules" and/or a "two micron process", we mean a CMOS process having design rules allowing the poly etch mask (i.e., the mask used for etching a polycrystalline silicon layer) to define an IGFET gate electrode, to have a feature size of about two microns. By "feature size", we mean the linear dimension of an IGFET polycrystalline silicon gate electrode between its associated source and drain regions. This dimension can also be referred to as the design gate length. However, in the resultant IGFET, the actual channel length under the gate electrode is slightly less than the feature size. This is due to lateral diffusion of the source and drain regions under the outer edges of the gate electrode. For example, with source and drain junction depths of about 0.35 micron, lateral diffusion under opposed edges of a gate electrode of two micron feature size produces an actual channel length of about 1.5 microns. To avoid possible confusion, we refer to the gate electrode as having a "length" between source and drain regions (not a "width"), to be consistent with the language used in referring to channel length.

IGFETs with such small channel lengths operate at higher speed. That is why IGFETs having channel lengths less than two microns can provide "high performance" or "high speed" in logic operation. For purposes of this invention, when we refer to a "high performance CMOS process" or a "high speed CMOS process", we mean a process capable of making CMOS logic IGFETs having channel lengths of less than about two microns.

As indicated above, in this invention an EPROM is concurrently made in a CMOS silicon chip along with a poly to metallization capacitor. Our EPROM is made using selected ones of the same steps that are used to make the high performance CMOS, combined with selected ones of the same steps used to make the poly to metallization capacitor. The monocrystalline silicon wafer 10 can be a homogeneous or epitaxial wafer having a surface 12 in which a plurality of integrated circuit chips would be integrally formed. Silicon surface 12 of each such chip would have many complementary transistor pairs and at least some poly to metallization capacitors. While not shown, it might also have some poly resistors formed on the field oxide, or have diffused or ion implanted resistors formed in the silicon surface 12. In this invention, the silicon surface 12 would also have an EPROM. For simplicity, the drawing shows formation of only one CMOS pair, one poly to metallization capacitor, and one EPROM. The reason is that in this invention, our distinctive EPROM structure is made by combining selected ones of the steps used to make each IGFET of the CMOS pair and the poly to metallization capacitor.

The surface 12 of the silicon wafer 10 would preferably be doped p-type with boron to a conductivity of about 10–20 ohm-cm. Then, the surface 12 of wafer 10 is thermally oxidized. The thermal oxidation forms a silicon oxide blanket layer 14 of about 5500 angstroms thick on silicon surface 12, as shown in FIG. 1. Then, as also shown in FIG. 1, a window 15 is photolithographically opened in a portion of the oxide layer 14 over each site in the silicon surface 12 where an N-well is to be formed. The silicon surface 12 is exposed in the window 15 at each such site. Then, a thin (about 500 angstrom thick) layer 14a of silicon oxide is thermally grown on the exposed silicon surface at each such site. FIG. 1 shows the wafer surface 12 after the thin oxide layer 14a has been thermally grown.

It is to be recognized that the oxide layer 14 will thicken slightly when the thin oxide layer 14a is grown in window 15. It is also to be noted that the oxide layer 14a is thin enough to allow ions to be implanted through it into its underlying silicon surface but is thick enough to protect surface 12 from implantation damage. FIG. 1 also shows that wafer 10 is given a blanket implant of an n-type impurity such as phosphorous. The implant is given in a dose of about $1 \times 10^{12}$ to $1 \times 10^{13}$ atoms per square centimeter, at an energy of about 60 to 180 keV. The thick oxide layer 14 masks all of surface 12 from the implant except over the surface sites within each window 15. In each window 15, the implant penetrates the thin oxide layer 14a and lodges atoms of dopant in the underlying site of silicon surface 12.

The implanted n-type dopant at each such site is then driven-in to a depth of about 2 microns to 8 microns by heating for about 1 to 6 hours in an annealing or oxidizing atmosphere. An n-well 16 is thus formed at each such site in silicon surface 12 where there was a window 15 in the thick oxide layer 14. The n-well 16 is an island-like n-type region inset into the p-type surface 12 of silicon wafer 10. This provides an integral n-type island in the p-type wafer where p-channel IGFETs can be formed. As indicated above, the combination of such p-channel IGFETs and of n-channel IGFETs made on an adjacent part of silicon surface 12 provide a high speed CMOS pair.

Figure 2:
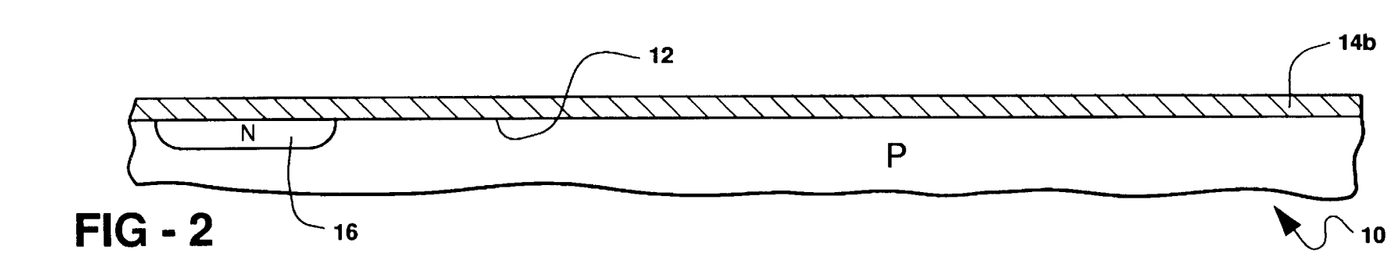

FIG. 2 illustrates that the thermal oxide layer 14 of FIG. 1 is removed after n-well 16 is formed, and replaced with a thin thermally grown silicon oxide blanket layer 14b. Oxide layer 14b has a thickness of about 500 angstroms.

Figure 3:
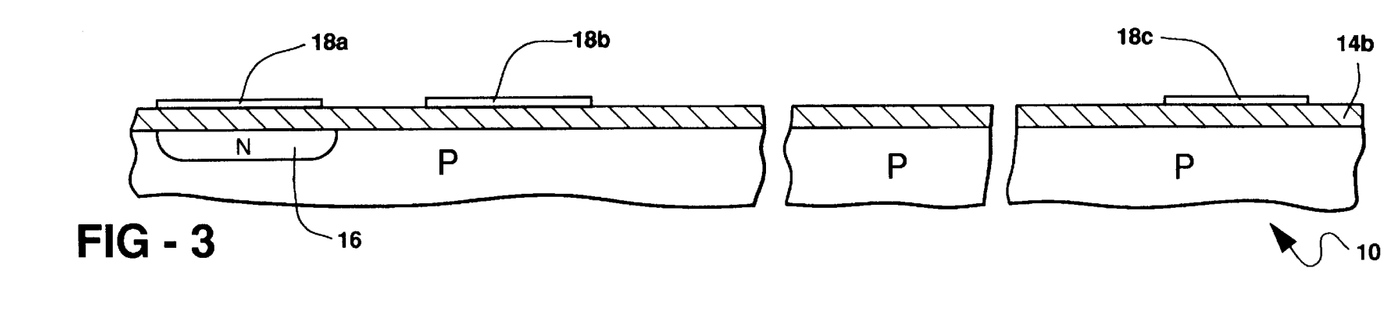

As can be seen from FIG. 3, thin oxide layer 14b is a pre-nitride oxidation, to prepare silicon surface 12 to receive a 1500–2500 angstrom thick silicon nitride blanket layer (not shown in blanket form) that is deposited by low pressure chemical vapor deposition (LPCVD). The silicon nitride blanket layer is then photolithographically masked and etched to form silicon nitride islands 18a, 18b and 18c on thin silicon oxide layer 14b. Silicon nitride islands 18a, 18b and 18c are respectively disposed over silicon surface areas 12a, 12b and 12c. In plan view, surface area 12a, 12b and 12c are identically sized small rectangular areas aligned along their length. A p-channel MOS transistor is to be formed in surface area 12a. An n-channel MOS transistor is formed in each of surface areas 12b and 12c. The n-channel MOS transistor formed in surface area 12c has an electrically floating gate electrode and forma part of our distinctive EPROM. The plan view shape of these small rectangular areas can also be ascertained by reference to FIGS. 14 and 15, which show the rectangular outline of surface area 12c.

Surface areas 12a–12c, being covered by silicon nitride islands 18a–18c, will be protected during subsequent oxidation of surface 12. Accordingly, areas 12a–12c will be areas having a significantly lesser oxide thickness on them from subsequent processing. They are sometimes referred to as "active" areas, because "active" devices will be formed on most of them in the completed integrated circuit.

Figure 4:
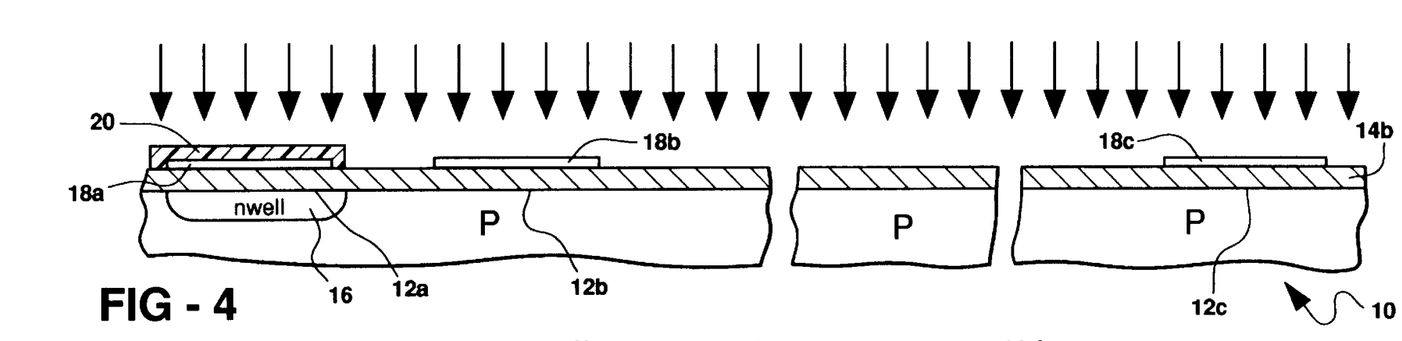

The silicon nitride islands 18a, 18b, and 18c are also shown in FIG. 4. As will hereinafter be seen, silicon nitride island 18a covers an active area 12a where a p-channel IGFET will be formed. Silicon nitride island 18b covers a silicon surface active area 12b where an n-channel IGFET will be formed. Silicon nitride island 18c covers surface area 12c, where part of our distinctive EPROM is to be formed.

FIG. 4 also shows that the surface 12 is given a field ion implantation. For this implantation, the n-well 16 is protected from the implant by a covering patch 20 of photoresist. The field implantation is of an p-type impurity such as boron. The implantation is done in a dose of about $1\times10^{13}$ to $1\times10^{14}$ atoms per square centimeter, at an energy of about 15 to 40 keV. The field implant does not cause a conductivity type change, and does not form a part of this invention. It is thus not shown in the drawing, to simplify understanding of the drawing.

Figure 5:
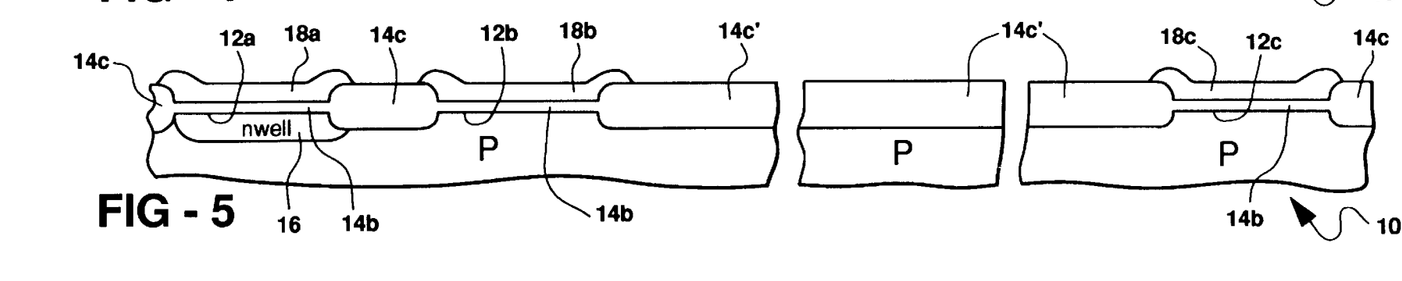

Reference is now made to FIG. 5. Following the field implant, photoresist patch 20 is removed. Wafer 10 is then heated in an oxidizing atmosphere to thermally grow an 8500 angstrom thick silicon dioxide layer in all areas of silicon surface 12 that are not protected by the silicon nitride islands 18a, 18b, and 18c. This 8500 angstrom thick thermal oxide is referred to as field oxide. It forms a thick oxide blanket or matrix 14c within which island-like thin oxide active areas 12a, 12b, and 12c are integrally disposed. It is to be observed that the thick oxide matrix 12c has an expanded area 14c' in a middle portion of FIG. 5. This expanded area 14c' of field oxide is important to this invention. Area 14c' provides a large and substantially isolated area upon which a poly to metallization capacitor is to be formed. In this invention area 14c' is enlarged further to accommodate an integral part of our distinctive EPROM, which will hereinafter be explained.

After the desired thickness of field oxide is grown, the silicon nitride islands 18a–18c are removed, starting first with a silicon oxide etch to remove any silicon oxide surface film that may have formed on the silicon nitride during field oxidation. The silicon nitride islands 18a, 18b and 18c are then etched away, as well as the thin silicon dioxide layer 14b that each of them covered on surface active areas 12a, 12b and 12c.

Figure 6:
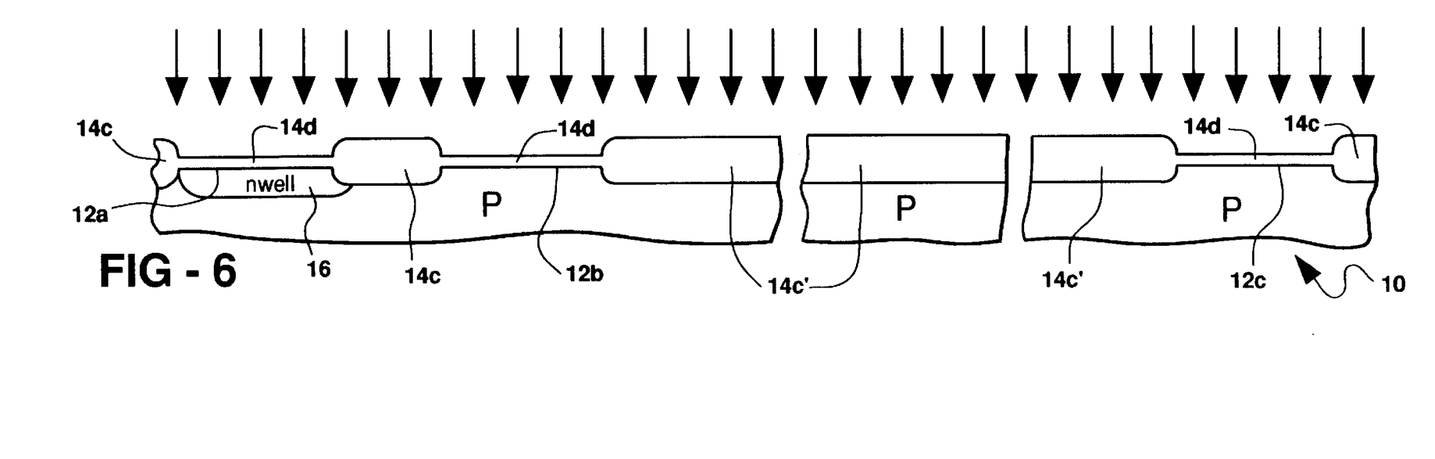

Referring now to FIG. 6, a 400 angstrom thick oxide layer 14d is then grown on the silicon surface active areas 12a, 12b and 12c. This silicon oxide layer 14d is preferably grown under conditions similar to those used to form gate oxide 14e of FIG. 8. Silicon wafer 10 is then given a blanket enhancement implant of the dopant boron at a dosage of about $1\times10^{11}$ to $1\times10^{13}$ atoms per square centimeter at an energy of about 20 to 60 keV. The enhancement implant adjusts threshold voltage of the MOS transistors involved. This enhancement implant will inherently also adjust the threshold voltage at our EPROM on surface area 12c. The adjustment sets their threshold values to a predetermined level.

Figures 7, 8:
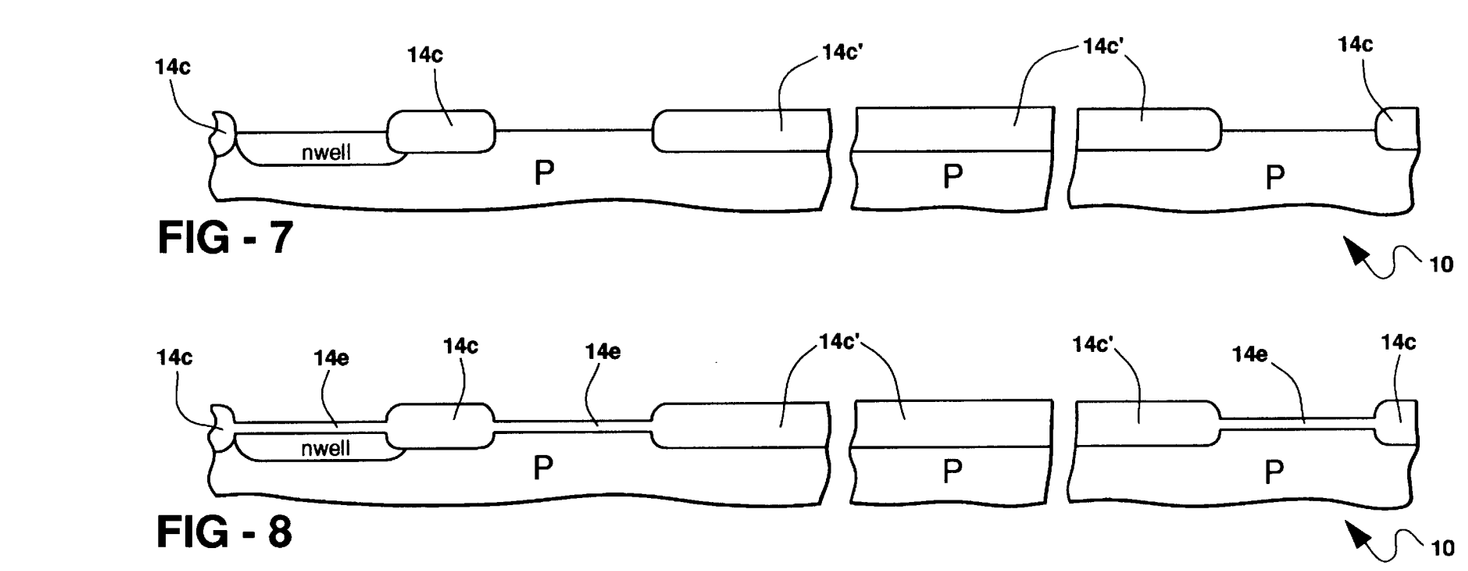

FIG. 7 shows that the 400 angstrom thick silicon oxide layer 14d is then etched away from silicon surface active areas 12a, 12b and 12c after the implant of FIG. 6.

FIG. 8 shows that a new 400 angstrom thick layer 14e of silicon oxide is thermally regrown on the silicon surface areas 12a, 12b and 12c. This new thermal oxide layer 14e is clean and suitable for use as a gate oxide for the IGFETs and EPROMs subsequently to be formed on surface 12 of wafer 10.

Figure 9:
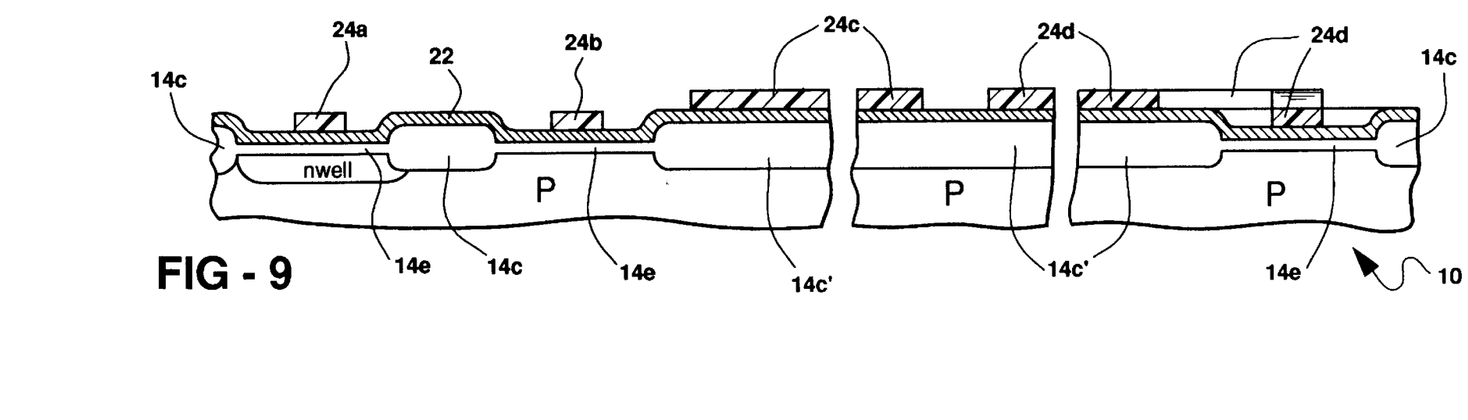

As can be seen in FIG. 9, a 3500 angstrom thick polycrystalline silicon blanket layer 22 is then deposited on top of the gate oxide/field oxide layer 14e/14c. Polycrystalline silicon is alternatively sometimes referred to herein as "polysilicon" or "poly". The poly blanket layer 22 is of Low Pressure Chemical Vapor Deposition (LPCVD) polycrystalline silicon that is doped with phosphorous or the like to be strongly n-type. As usual, conductivity, or doping, of the polycrystalline silicon layer 22 can be of the order of about 15 ohms per square to 1500 ohms per square. Doping can be done in any convenient manner. The poly layer 22 is deposited immediately after growing the gate oxide 14e, to preserve the high quality and purity of gate oxide layer 14e as a gate dielectric for an MOS transistor.

As FIG. 9 also shows, the polycrystalline silicon blanket layer 22 is covered with a photoresist mask that comprises patches, or mask elements, 24a, 24b, 24c and 24d. The patches 24a–24d have a plan view configuration respectively corresponding to the MOS gate electrodes 22a and 22b, the poly lower plate of the poly to metallization capacitor 22c, and the EPROM floating gate 22d (including its large extension. The photoresist mask patches 24a–24d leave exposed those portions of poly blanket layer 22 that are to be etched away. To do the etching, the exposed portions of polycrystalline silicon blanket layer 22 are first cleaned of any silicon oxide film incidentally formed thereon. Then, the exposed portions of the polycrystalline silicon blanket layer 22 are completely etched away in a normal and accepted manner. This etching defines a polycrystalline silicon pattern of electrodes and conductors on top of the silicon wafer 10.

Figure 10:
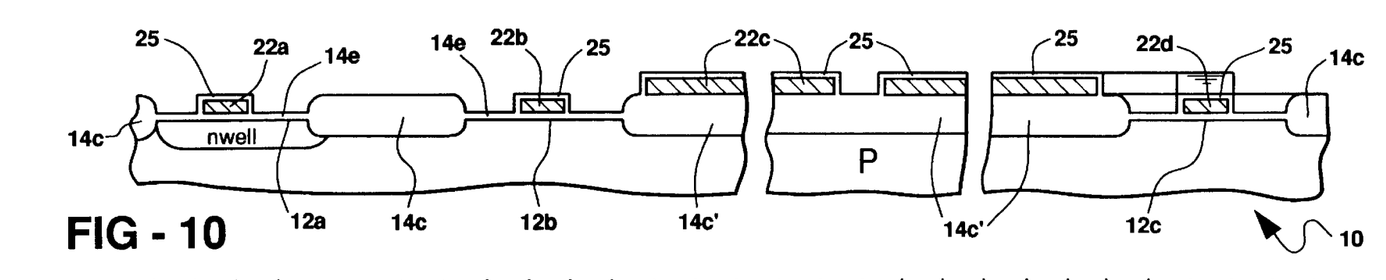

After etching the polycrystalline silicon blanket layer 22 into the above-mentioned polycrystalline silicon pattern, the photoresist etch mask is removed. Then, the as can be seen in FIG. 10, a 200–350 angstroms thick silicon oxide layer 25 is grown on the exposed surfaces of the polycrystalline silicon pattern segments 22a, 22b, 22c and 22d. This seals the outer surface of these segments, to prepare them for the final steps of the process. The result is the in-process configuration as shown in FIG. 10.

As indicated above, the polycrystalline silicon pattern includes self-aligning gate electrodes 22a and 22b for the CMOS transistors to be respectively formed in active areas 12a and 12b, and integral extensions of those electrodes (not shown) and other associated conductors (also not shown). The poly pattern also includes a lower plate or electrode 22c for a poly to metallization capacitor 32m over thick oxide area 14c'. The plan view size of thick oxide area 14c' and capacitor lower electrode 22c would probably actually be much larger than shown. This is also true for the portion of segment 22d of the poly pattern that is disposed on thick oxide area 14c'. However, for convenience of illustration, their size is shown in a reduced form. Segment 22d has a modified "U" shape in plan view, primarily for ease of illustration. For that reason, and to more easily compare its formation steps with those of the poly to metallization capacitor, segment 22d is shown with its larger part 22d" on field oxide portion 14c', adjacent the poly to metallization capacitor. Other layouts can be used, and would probably be preferred. More will be hereinafter said about alternative layouts.

As indicated above, element or segment 22d of the polycrystalline silicon pattern is an important part of this invention. Element 22d forms a floating gate electrode for the distinctive EPROM 34m of this invention. This further element 22d is distinctive in that it has a relatively small sized part 22d' over active area 12d and a relatively large sized part 22d" over thick oxide area 14c'. As can be seen by reference to FIG. 17, the element 22d parts are arranged in a general "U" shape. Element part 22d' centrally crosses silicon surface active area 12d. Hence, element part 22d' provides a self-aligned gate electrode for our distinctive EPROM 34m. In the EPROM 34m of this invention, element part 22d serves as an electrically floating gate.

Figure 12:
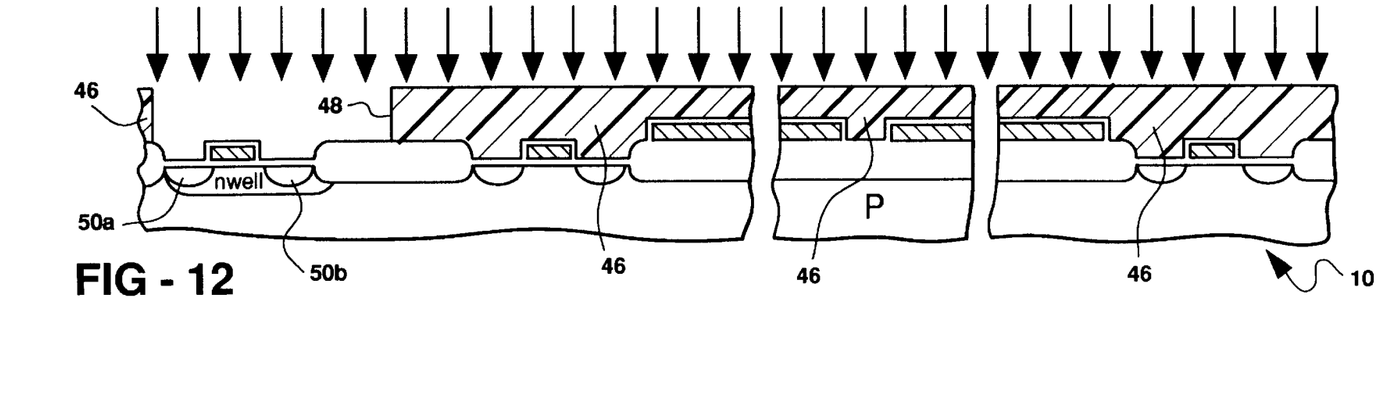

Referring to FIG. 12, the EPROM floating gate part 22d" that is disposed on the thick oxide area 14c' is a relatively large, plate-like portion that forms a top plate for a poly to metallization capacitor that is integral with our EPROM 34m. As indicated above, the plan view size of part 22d" would actually be much larger than shown, especially with respect to the size of extension 22d'. However, for convenience of illustration, relative size of part 22d" has been reduced. More will be said later about the actual size of floating gate part 22d" (in comparison with part 22d') and capacitance between the floating gate and an overlying metallization plate, as compared to the capacitance between floating gate 22d and wafer 10 (chiefly the EPROM channel region).

As will be explained later in this description, one would probably prefer a short and straight extension 22d' on floating gate 22d, to minimize cell size. Alternative configurations are disclosed in FIGS. 22–23 of the above-mentioned related Attorney Docket H-188616, which is incorporated herein by reference. Still further, the alternative configurations need not be limited by having its overlying metallization plate (hereinafter described) extend over the EPROM channel region. For manufacturing reasons, it would probably not even be preferred that the overlying metallization plate extend over the EPROM channel region. In this connection, see the alternative embodiment shown in FIG. 18 hereof.

Figure 17:
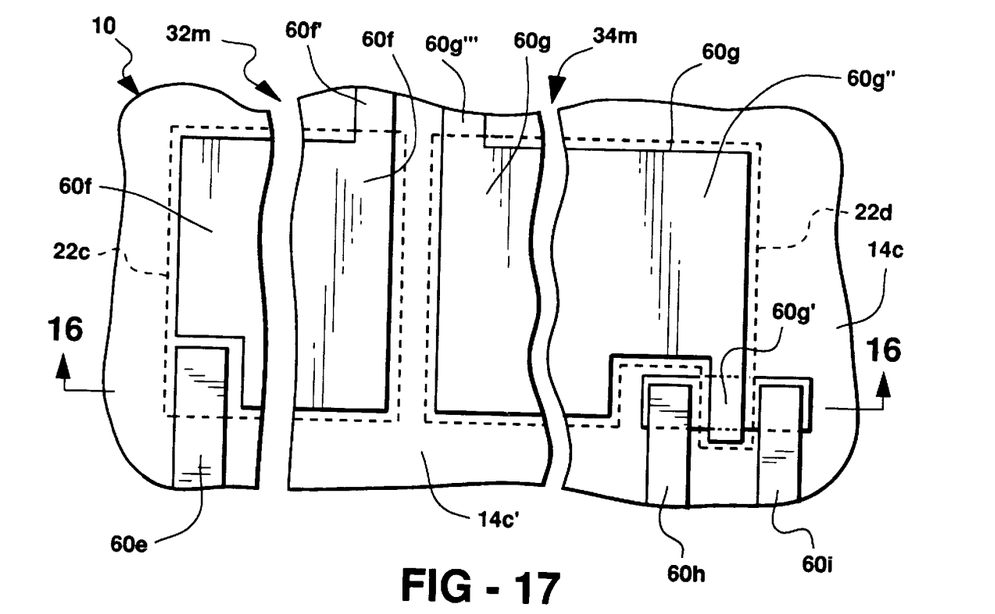
FIG. 17 shows a fragmentary plan view of the poly to metallization capacitor and of our distinctive EPROM that is taken along the line 17—17 of FIG. 16.

As indicated above, FIG. 17 shows the plan view configuration of floating gate 22d in dotted line. Bottom plate 22c of the poly to metallization capacitor is shown in dotted line to the left of the EPROM floating gate 22d. As mentioned, floating gate 22d of our distinctive EPROM 34m has a large portion 22d" disposed on thick oxide area 14c'. It has an integral extension, the end 22d' of which crosses active area 12c. The part 22d" is sized (in plan view) to provide a relatively large capacitance between the floating gate 22d and an overlying metal electrode that serves as a charging gate for the EPROM, which charging gate will hereinafter be described. By relatively large, we mean that this capacitance is relatively large in comparison to the capacitance between the floating gate 22d and the substrate wafer 10. The floating gate to charging gate capacitance should be at least twice the capacitance between the floating gate and the wafer 10. If this ratio in floating gate/charging gate capacitance to floating gate/substrate capacitance is about two or greater, preferably 3:1 to 5:1, or still greater, the floating gate of the EPROM can be charged at low voltages, i.e., 14 volts or less, typically 8–12 volts. Such low voltages are of a level that can be safely handled by the high performance CMOS transistors. Hence, in this invention, the high performance CMOS transistors can be used for programming an EPROM IGFET. In other words, a separate group of higher voltage programming transistors need not be included in the circuit. This simplifies the resulting integrated circuit not only from a circuitry standpoint but also from a fabrication standpoint. Process steps to make the high voltage transistors need not be included. As hereinbefore indicated, adding steps to the preferred high performance CMOS process can compromise the performance of the high density CMOS transistors being made from the modified high performance CMOS process. Hence, our invention provides still another advantage.

In the following steps of the process, the high performance MOS transistors, including our EPROM IGFET, are formed in the integrated circuit. As indicated above, the high performance MOS transistors are formed with geometries that provide gate nominal gate lengths of about two microns or less and attendant channel lengths of about 1.5 micron or less. The steps used to finish the integrated circuit are identical to what might be used in any high speed CMOS process that would include a poly to metallization capacitor.

Figure 11:
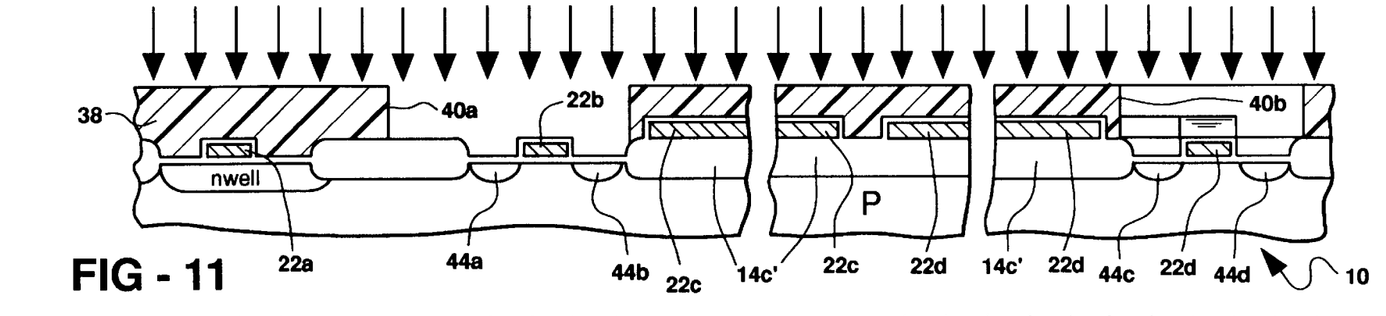

Next, as shown in FIG. 11, the upper surface of the silicon wafer 10 is masked with a thick blanket layer of photoresist 38. Windows 40a and 40b are then photolithographically opened in the blanket photoresist layer 38 over the active areas 12b and 12c. As indicated above, an n-channel MOS transistor, i.e., IGFET, is to be formed in the small rectangular left-hand part of active area 12b. Our distinctive EPROM is to be formed in surface area 12c and on the thick oxide portion 14c'. As indicated, our distinctive EPROM includes a high density MOS transistor with floating gate 22d formed in area 12c. One can view that floating gate part 22d' has an extension onto field oxide from surface area 12c, where it is expanded into a large plate 22d". As previously indicated, each chip on wafer 10 will have many areas such as active areas 12a–12c.

FIG. 11 also shows that silicon wafer 10 is then given an N+ implant. This implant is done to respectively form the self-aligned n-type source and drain regions 44a and 44b on opposite sides of the silicon gate electrode 22b, and the self-aligned n-type source and drain regions 44c and 44d on opposite sides of our EPROM silicon gate electrode part 22d'. Source and drain regions 44a–44d can be implanted in the usual manner, as for example with an implant of the n-type dopant arsenic or co-implant of the N-type dopants arsenic and phosphorous at a dosage $1 \times 10^{15}$ to $1 \times 10^{16}$ atoms per square centimeter at an energy of about 25 to 200 keV.

The photoresist 38 is then removed, and the surface of silicon wafer 10 is cleaned. Then, silicon wafer 10 is heated for an appropriate time to drive in the implanted dopant somewhat and to help move the implanted n-type dopant into substitutional positions in the crystal lattice of silicon active regions 12b and 12c. This heating results in the formation of N-type regions 44a, 44b, 44c and 44d.

A new blanket layer 46 of photoresist is then applied to the upper surface of wafer 10. As shown in FIG. 12, a window 48 is then photolithographically opened in photoresist layer 46 over each active area 12a on the upper surface of silicon wafer 10. Active area 12a is disposed over each n-well 16, where a p-channel MOS transistor is to be formed. The upper surface of silicon wafer 10 is then given a blanket P+ implant using the p-type dopant boron or $BF_2$.

The implant is at a dosage of about $5 \times 10^{14}$ to $6 \times 10^{15}$ atoms per square centimeter, and at an energy of about 20 to 80 keV.

Analogous to the preceding N+ implant, the P+ implant does not penetrate the photoresist layer 46, the 8500 angstrom thick field oxide, or the polycrystalline silicon self-aligned gate electrode 22a. On the other hand, it can penetrate the thin silicon oxide layer 14e on either side of the silicon gate 22a. Then, the photoresist layer 46 is removed. Thereafter, the silicon wafer 10 is heated to drive-in the implanted p-type dopant and move it into substitutional positions in the crystal lattice. This heating of the p-type implant forms p-type regions 50a and 50b in N-well 16. As can be seen, p-type regions 50a and 50b are self-aligned with the edges of silicon gate 22a.

The upper surface of wafer 10 is then ready to began the metallization process and complete formation of the poly to metallization capacitor. Any of the normal and accepted metallization techniques can be used. However, as is usual for a poly to metal capacitor, after application of the glass coating and before depositing the metal, the glass has to be thinned out over the poly plate of the capacitor. In this invention, the glass is also thinned out over the enlarged part 22d" of our distinctive floating gate.

In one example of metallization, the upper surface of wafer 10 is given a blanket layer (not shown in blanket form) of boro-phosphosilicate glass (BPSG) or phosphosilicate glass (PSG). It can be deposited by low pressure chemical vapor deposition (LPCVD) or plasma enhanced chemical vapor deposition (PECVD) to a layer thickness of about 5000 angstroms. The blanket BPSG or PSG layer is then densified in an appropriate heating step, which reflows it and smooths out its upper surface. One example of densification heating is to heat at about 900° C. for about 15 minutes.

A thin layer of a spin-on-glass (SOG) (not shown) can be applied onto the PSG layer upper surface 54, and then densified, as for example by heating at about 825° C. for about 10 minutes. This provides an even smoother and more impervious coating on the upper surface 54 of the PSG glass blanket layer.

Figure 13:
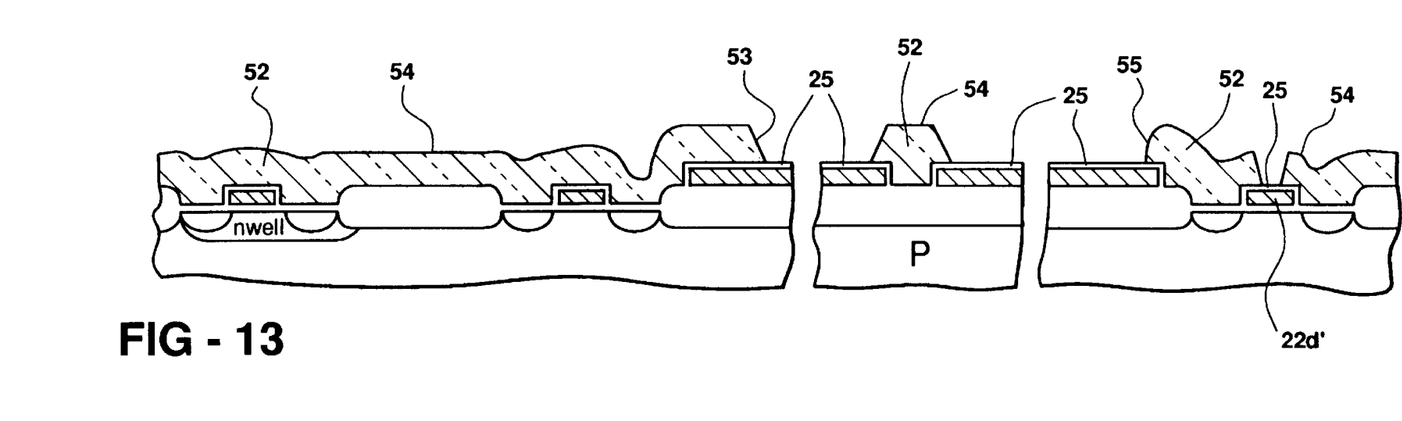

A photoresist coating (not shown) is then applied to the glass upper surface 54, and windows opened in it over each of poly segments 22c and 22d". The glass layer is then plasma etched or reactive ion etched to open large windows 53 and 55 in the glass layer 52. This at least thins the glass in the area of the windows, if not removing it entirely. If the removed entirely, the silicon oxide coating 25 on the poly segments 22c and 22d' will be exposed. This oxide coating can provide an acceptable capacitor dielectric. The result is as shown in FIG. 13. It should be noted that if the etching proceeds too far, the exposed portions of the dielectric coating 25 on segments 22c and 22d" may be etched away. If so, a new dielectric coating, preferably of a thickness of about 200–350 angstroms, will have to be provided on the exposed surfaces of poly segments 22c and 22d". In such instance, one may elect to thermally reform the poly oxide or to deposit a blanket coating of a suitable dielectric over the glass coating, to cover the exposed parts of 22c and 22d". Its thickness would probably be comparable to that of the poly oxide but its preferred thickness would of course dependent on a variety of factors including its dielectric strength. The result of these alternative techniques is also intended to be encompassed by what is shown in FIG. 13 and the following figures.

Figure 14:
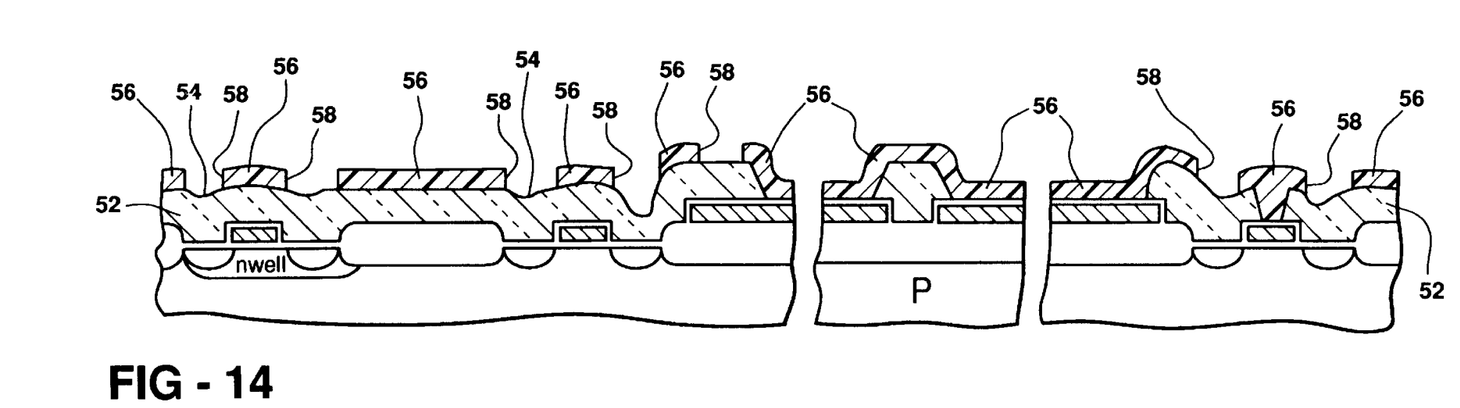

Another photoresist coating is then applied to the glass upper surface 54. It is photolithographically defined into a contact mask that is comprised of segments 56. The contact mask has a contact window 58 over each area of glass upper surface 54 where an electrical contact is to be etched. The resultant upper surface of wafer 10 is as shown in FIG. 14.

The upper surface of wafer 10 is then plasma etched or reactive ion etched to open contact windows in the glass layer 52. Concurrently, the etching proceeds to also remove any silicon oxide layers exposed at the bottom of the contact windows. Such windows are opened to each of the source and drain regions 44a–44d and 50a–50b, to each gate electrode of the CMOS circuitry that requires a separate contact, and to the lower polycrystalline silicon plate 22c of the poly to metallization capacitor 32m. However, the CMOS gates are ordinarily not contacted in the silicon surface active areas themselves. Instead, they are contacted in other locations, remote from the channel region of the MOS transistor for which they are a gate. In some instances, the polycrystalline silicon itself forms a connecting network between MOS transistors so that no direct metal contact to each gate is necessary. Accordingly, and for simplicity, in FIG. 15 and following figures, no gate contact window is shown opened to the gate electrodes 22a and 22b, that are respectively above active areas 12a and 12b.

No contact window is opened to poly segment 22d, because no contact is needed. It is an electrically floating gate electrode. On the other hand, as indicated above, the source and drain regions 44c and 44d of our EPROM are to be contacted, analogous to the contacts made to the source and drain of each MOS transistor. Accordingly, windows are opened in the glass layer 52 to accommodate them.

Figure 15:
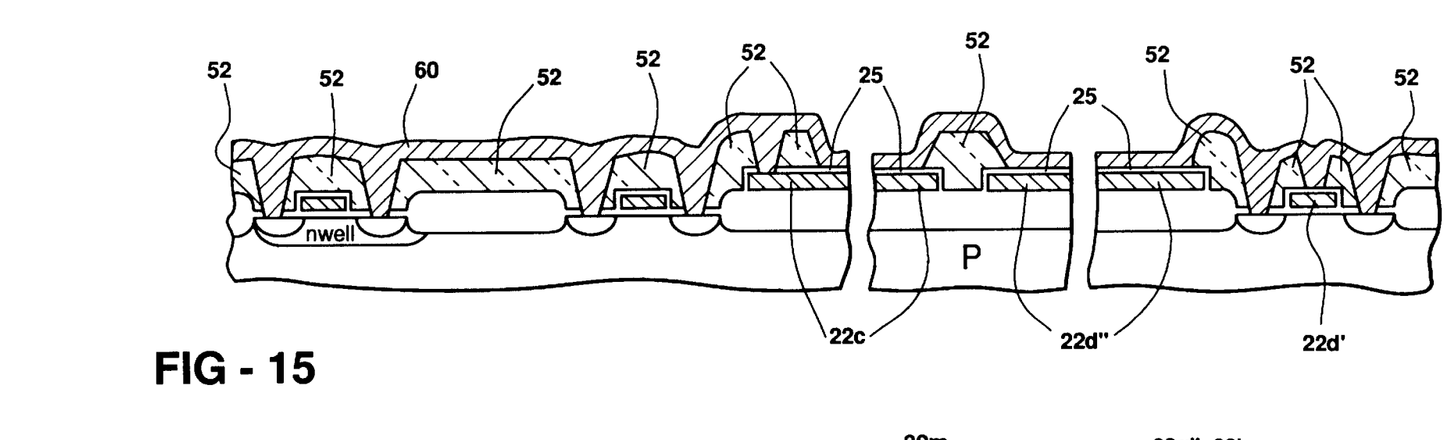

After the contact windows are opened in the glass layer 52, the photoresist etch mask is removed and a blanket coating 60 of one or more contact metals is deposited onto the upper surface 54 of the glass layer 52. In one example, a single layer of an aluminum alloy could be used. The result is as shown in FIG. 15.

Figure 16:
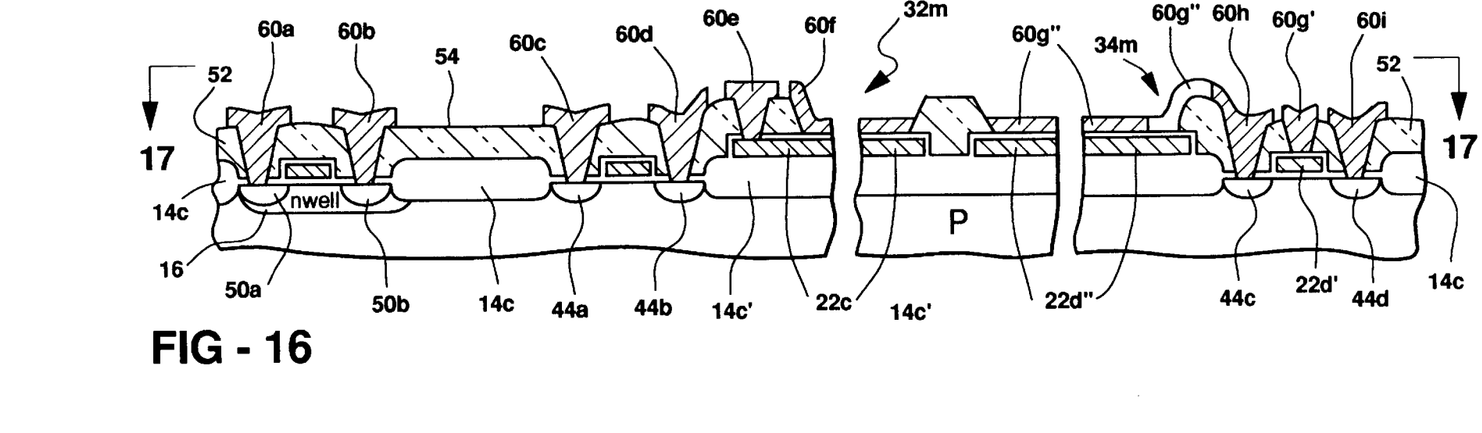

The blanket coating 60 of contact metal is then photolithographically masked and etched, to delineate a plurality of metal contacts 60a–60i on the surface 54 of glass layer 52, as seen in FIGS. 16 and 17. Any of the conventional metallization masking and etching techniques can be used to form contacts and electrodes 60a–60i. Contact 60a is in low resistance electrical contact with region 50a. Contact 60b is in low resistance electrical contact with region 50b. Contacts 60c and 60d are respectively in low resistance electrical contact with regions 44a and 44b. Contact 60e is in low resistance electrical contact with the large poly lower plate 22c of the poly to metallization capacitor 32m. Metallization area 60f is a large area electrode that forms the upper plate of the poly to metallization capacitor 32m. Metallization area 60g is a large area electrode that forms the upper plate of a floating gate to metallization capacitor, and is an important part of our distinctive EPROM 34m. Contacts 60h and 60i are respectively in low resistance electrical contact with n-type regions 44c and 44d of our EPROM 34m. Contacts 60a–60d are analogous in plan view to contacts 60h–60i that are shown in FIG. 17.

As can be seen from FIGS. 16 and 17, electrodes 60f and 60g have a large area as compared to the contacts 60e, 60h and 60i. It is also to be noted that they each have a periphery, as viewed in FIGS. 17 and 18, that generally corresponds to the poly plate below them, except for their metallization runners 60f' and 60g'" that extend from them to other parts of the integrated circuit on wafer 10. Still further, it is also to be noted in FIGS. 17 and 18 that electrodes 60f and 60g are disposed wholly within the periphery of their respective underlying poly plates 22c and 22d.

Figure 18:
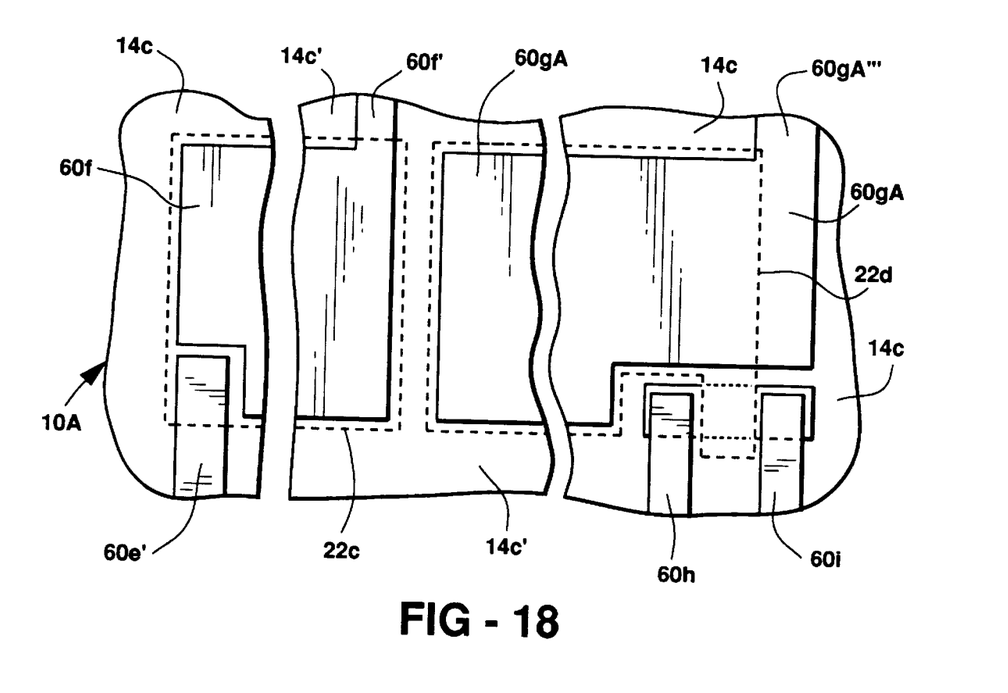
FIG. 18 shows a plan view similar to that of FIG. 17 but of an alternative embodiment of the invention.

In addition, FIGS. 17 and 18 are intended to represent that electrodes 60f and part 60g" of electrode 60g are nested in recesses, or depressions, in the glass coating 52. The recess outline in glass coating 52 for electrode 60f generally follows the dotted line outline of the poly plate 22c underlying electrode 60f. The recess outline in the glass coating 52 for electrode 60g generally follows the outline for the underlying part 22d" of floating gate 22c for purposes of illustration. However, having the 60g recess in the glass layer 52 also extend between the recesses for EPROM contacts 60h and 60i is difficult to do from a manufacturing standpoint, even though it might help provide a larger capacitance between the charging gate and the poly gate of the EPROM. It is particularly difficult to etch a recess between EPROM contacts 60h and 60i if the MOS transistor structure of our EPROM is made with two micron design rules, as it probably would be. On the other hand the contribution of the relatively small part 60g' of charging gate 60g to larger capacitance is small. For this reason, the part 60g' of the charging electrode is preferably either placed on top of the glass layer 52, or omitted entirely, as shown in FIG. 18. Metal runner 60''' is not in the recess in FIGS. 17 and 18 but on the top surface 54 of glass layer 52. If charging electrode part 60g' is also on top of the glass layer 52, then the only part of the charging gate 60g that would be in the recess is part 60g".

Thus, all of electrode 60f is closely spaced to its underlying poly plate 22c, and all of electrode part 60g" is closely spaced to its underlying poly floating gate part 22d". The desired dielectric spacing between 60f and 22c, and between 60g" and 22d" is less than about 1000 angstroms and preferably less than about 500 angstroms. It will clearly be less than the thickness of the glass layer if a thickness of glass is used that exceeds 1000 angstroms. In the latter connection, it is to be noted that the foregoing description presupposes that the glass layer 52 will exceed 500–1000 angstroms. If it does not, and especially if the capacitances needed are not especially large, little or no etching of the glass surface will be needed.

Alternative to the above, one could form electrodes 60f and 60g first, and apply the covering glass coating 52 afterwards. In such instance, the poly plate 22c and its covering electrode 60f would be spaced by the 200–350 angstrom thick poly oxide that had been previously formed. Poly floating gate 22d would be similarly spaced from its overlying metal electrode 60g. Even in this structure, it would probably be preferred to omit charging gate part 60g'. In such a structure, electrodes 60f and 60g would be covered by glass layer 52. Thus, when the contact mask is cut in the glass layer 52, additional contact windows would have to be cut to make contact with the electrodes 60f and 60g. Correspondingly, the metallization pattern would have to include contacts to electrodes 60f and 60g. Other processing arrangements and layouts could also probably be used. It is contemplated that this invention encompasses all of them.

Our EPROM cell comprises the elements on substrate surface portions 12c and on thick oxide portion 14c'. As indicated above, electrode 60g forms the charging electrode, or gate, of our distinctive EPROM. Electrode portion 60g" and its underlying large portion 22d" of the EPROM floating gate are sized to provide a significantly larger capacitance than exists between floating gate 22d and p-type silicon substrate 10. By including these large elements in the EPROM cell, the cell becomes larger. However, it permits one to achieve a higher ratio in the charging gate to floating gate capacitance (Ccg-fg) divided by the floating gate to substrate capacitance (Cfg-s). As repeated above, the ratio of Ccg-fg/Cfg-s should be at least about 2. This permits the floating gate to be charged at lower voltages, typically of less than about 12 volts. This is compatible with CMOS circuits that use a five volt supply voltage and have a breakdown voltage of about 17 volts.

Metal electrode part 60g" is substantially registered over EPROM floating gate portion 22d" and lies substantially within it when seen in plan view. Hence, they have a large area of overlap. Since this large overlapping area is only separated by a relatively thin layer of dielectric, metal electrode part 60g" and floating gate 22d can have a relatively large capacitance between them. On the other hand, except for its part that crosses the small active area 12c, floating gate 22d is disposed on the thick field oxide 14c. It therefore has a relatively low, and at least significantly lesser, capacitance with its underlying parts of silicon substrate 10 than it has with metal electrode 60g.

For manufacturing reasons, we prefer that floating gate part 22d' be as short as possible in comparison with floating gate part 22d", to obtain the highest ratio of Ccg-fg/Cfg-s. This can best be done with different configurations of floating gate 22d that are not "U" shaped in plan view. Analogously, the configuration of the metal charging gate, or electrode, 60g can be varied too for manufacturing or other reasons. For example, and as shown in FIG. 18, one may elect to omit the part 60g' of the charging gate 60g and reverse the location of the metallization runners 60f' and 60g''' but keep the balance of the layout as is shown in FIG. 17.

In a related thought, various alternative layouts and geometries of the components described above can be made, as well as various alternative layouts of conductors for electrical connection to them. The layouts and geometries shown are only for illustration and are intended to represent but one of many possible layouts and geometries. It is recognized that a preferred layout and geometry for a specific application will probably vary from what is shown herein, to obtain the smallest cell size. Accordingly, other layouts will than what is shown might be preferred. For example, Our EPROM could have a layout that is a mirror image of what is shown in either of FIGS. 17 or 18. Also, the large parts 22d" and 60g of our EPROM could be disposed wholly above silicon surface area 12c in FIGS. 17 and 18. Also, one may choose to have a poly runner extend from the poly plate 22c to other parts of the circuit, instead of providing a separate metallization contact 60e to it.

The foregoing discussion discloses and describes several exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. A method of making an integrated circuit on a substrate of semiconductor material, which integrated circuit includes MOS transistors, a poly to metallization capacitor and at least one EPROM transistor, said method comprising the steps of:

forming high speed MOS transistors on thin oxide areas of said substrate using a process having about two micron or less design rules for the MOS transistors;

forming at least one poly to metallization capacitor on said substrate, said capacitor being disposed on field oxide and comprising a first polycrystalline silicon segment serving as a lower capacitor plate and an overlying electrode of metal serving as an upper capacitor plate;

concurrently also forming at least one EPROM transistor on said substrate using a selected combination of steps used to make the high speed MOS transistors and the poly to metallization capacitor, said EPROM transistor having a polycrystalline silicon floating gate that has an extension from a channel area of said EPROM onto field oxide; said extension being enlarged in area compared to said channel area; at least said extension of said floating gate having an overlying metal charging electrode and providing an area of overlap therebetween that is large in comparison with said channel area, wherein the EPROM transistor has a charging gate to floating gate first capacitance, and a floating gate to substrate second capacitance; and providing a respective capacitance ratio between said first and second capacitances of about two:one or greater;

effective to allow the EPROM transistor to be made along with the high speed MOS transistors and the poly to metallization capacitor by merely incorporating changes in masks used to make said integrated circuit, and the floating gate of the EPROM transistor can be charged at voltages that can be handled by said high speed MOS transistors.

2. The method of claim 1 wherein:

the capacitance ratio between the first and second capacitances is about 2:1 to 5:1.

3. The method of claim 1 wherein:

a single polycrystalline silicon deposition step is used to concurrently form the lower plate of the poly to metallization capacitor and the floating gate of the EPROM; and a single metal deposition step is used to concurrently deposit the upper plate of the poly to metallization capacitor and the charging electrode of the EPROM.

4. The method of claim 3 wherein:

the capacitor's first doped region and its overlying polycrystalline silicon plate are spaced by a dielectric;

the EPROM's second doped region and its overlying floating gate are spaced by a dielectric; and dielectric spacing between the capacitor's lower and upper plates is the same as dielectric spacing between the EPROM's floating gate and its charging electrode.

5. The method of claim 3 wherein:

dielectric thickness and composition between the capacitor's lower and upper plates is the same as dielectric thickness and composition between the EPROM's floating gate and its charging electrode.

6. The method of claim 5 wherein:

the capacitance ratio between the first and second capacitances is about 2:1 to 5:1.

7. The method of claim 6 wherein:

the extension of the EPROM transistor floating gate that is disposed in the field oxide has an area that is more than twice said channel area of said EPROM.

8. A method of making an EPROM transistor in a CMOS integrated circuit made with a process having two micron or less design rules, comprising the steps of:

forming a matrix of field oxide on a surface of a semiconductive substrate, said matrix having a surface and delineating a plurality of active areas that are spaced on said substrate surface by said field oxide;

forming a well of one conductivity type in an active area portion of opposite conductivity type in said substrate; said well extending into said substrate from said substrate surface;

forming a first dielectric coating of MOS transistor gate dielectric thickness on at least said active areas of said surface;

depositing a blanket layer of gate electrode material over said dielectric coating and said field oxide matrix surface;

defining said blanket layer of gate electrode material into gate electrodes for complementary MOS transistors, a lower plate for a poly to metallization capacitor, and a floating gate for an EPROM MOS transistor, said floating gate electrode being defined to have an integral extension that extends from a channel area of said EPROM onto said matrix surface, said floating gate extension s being enlarged over said matrix surface so that capacitance between said it and an overlying charging electrode can be at least about double a capacitance between said floating gate and said substrate;

forming source and drain regions for said MOS transistors under said dielectric coating at opposed edges of said gate electrodes including said floating gate electrode, with the source and drain regions being of opposite conductivity type from the substrate surface in which they are disposed;

forming a second dielectric coating on said gate electrode material;

simultaneously forming both an upper plate for said poly to metallization capacitor and also a charging electrode for said floating gate of said EPROM, said charging electrode overlapping said floating gate extension with an area that provides a floating gate to charging electrode capacitance that is at least twice a capacitance between said floating gate and said substrate; and forming appropriate conductive connections to said source and drain regions, to said capacitor plates, to said charging electrode, and to said gates but not said floating gate, effective to make an EPROM in said CMOS integrated circuit that has an electrically floating gate that can be charged at voltages handled by said MOS transistors in said integrated circuit.

9. The method of claim 8 wherein:

the substrate is a wafer of p-type silicon;

the blanket layer of gate electrode material is polycrystalline silicon; and the second dielectric coating is thermally formed polycrystalline silicon oxide.

10. The method of claim 9 wherein:

the upper plate of the capacitor, the charging electrode of the EPROM and the contacts to the MOS transistor source and drain regions are formed simultaneously; and the floating gate extension and its overlying charging electrode are sized to have a capacitance that is about two to five times the floating gate to substrate capacitance.

* * * * *